United States Patent
Cho et al.

(10) Patent No.: US 10,457,842 B2
(45) Date of Patent: Oct. 29, 2019

(54) CURABLE COMPOSITION

(71) Applicant: LG CHEM, LTD., Seoul (KR)

(72) Inventors: Yoon Gyung Cho, Daejeon (KR); Hyun Jee Yoo, Daejeon (KR); Seung Min Lee, Daejeon (KR); Suk Ky Chang, Daejeon (KR); Jung Sup Shim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 662 days.

(21) Appl. No.: 14/767,182

(22) PCT Filed: Sep. 24, 2014

(86) PCT No.: PCT/KR2014/008901
§ 371 (c)(1),
(2) Date: Aug. 11, 2015

(87) PCT Pub. No.: WO2015/046880
PCT Pub. Date: Apr. 2, 2015

(65) Prior Publication Data
US 2015/0368528 A1    Dec. 24, 2015

(30) Foreign Application Priority Data

Sep. 24, 2013 (KR) .................. 10-2013-0113532

(51) Int. Cl.
| | |
|---|---|
| *C09J 163/00* | (2006.01) |
| *C08L 63/00* | (2006.01) |
| *C08L 101/02* | (2006.01) |
| *H01L 51/52* | (2006.01) |
| *C08K 5/5435* | (2006.01) |
| *H01L 51/00* | (2006.01) |
| *C08G 59/50* | (2006.01) |
| *C08L 101/04* | (2006.01) |

(52) U.S. Cl.
CPC ........ *C09J 163/00* (2013.01); *C08G 59/5073* (2013.01); *C08K 5/5435* (2013.01); *C08L 63/00* (2013.01); *C08L 101/02* (2013.01); *C08L 101/04* (2013.01); *H01L 51/0035* (2013.01); *H01L 51/5253* (2013.01); *H01L 51/5259* (2013.01)

(58) Field of Classification Search
None
See application file for complete search history.

(56) References Cited

U.S. PATENT DOCUMENTS

| | | | |
|---|---|---|---|
| 4,529,755 A | 7/1985 | Nishikawa et al. | |
| 2011/0024172 A1* | 2/2011 | Maruyama | H01L 23/49822 174/258 |
| 2012/0270381 A1* | 10/2012 | Joo | C09J 163/00 438/460 |
| 2013/0240862 A1* | 9/2013 | Yoo | H01L 51/5246 257/40 |
| 2014/0275342 A1* | 9/2014 | Guo | C08G 59/1438 523/400 |
| 2015/0017450 A1 | 1/2015 | Oka et al. | |
| 2015/0287940 A1 | 10/2015 | Yoo et al. | |
| 2015/0329747 A1* | 11/2015 | Cho | C09J 123/20 257/40 |

FOREIGN PATENT DOCUMENTS

| | | | |
|---|---|---|---|
| CN | 101223206 A | 7/2008 | |
| EP | 2637229 A2 | 9/2013 | |
| EP | 2778185 A2 * | 9/2014 | ......... C08G 59/1438 |
| JP | 60-004521 A | 1/1985 | |
| JP | 2007-002110 A | 1/2007 | |
| JP | 2007-112956 A | 5/2007 | |
| JP | 2012-533643 A | 12/2012 | |
| JP | 2013-23671 A | 2/2013 | |
| KR | 10-2008-0030581 A | 4/2008 | |
| KR | 10-2012-0113902 A | 10/2012 | |
| KR | 10-2013-0058637 A | 6/2013 | |
| TW | 201111438 A1 | 4/2011 | |
| WO | 2011/008295 A1 | 1/2011 | |
| WO | WO 2011046238 A1 * | 4/2011 | ............ C09J 163/00 |
| WO | 2012/060621 A2 | 5/2012 | |
| WO | WO 2012060621 A2 * | 5/2012 | ......... H01L 51/5246 |
| WO | 2013/111697 A1 | 8/2013 | |

OTHER PUBLICATIONS

Ko Min Jin et al., "Curable Composition", machine translation of KR 20130058637A, Apr. 6, 2013.*
Compound summary of "Methyl Ethyl Ketone" from PubChem, retrived on Apr. 25, 2018, pp. 1-10.*
Hyogyeong Lee, "Curable Composition", English translation of KR 10-2013-0058637 A, published Jun. 4, 2013. (Year: 2013).*

* cited by examiner

*Primary Examiner* — Anish P Desai
(74) *Attorney, Agent, or Firm* — Dentons US LLP (57) ABSTRACT

The present invention relates to a curable composition and an adhesive film including the same, and provides a curable composition and an adhesive film which may prevent damage to an element from moisture contained in the composition, ionic substances, and other foreign substances, and effectively block electrochemical corrosion, thereby improving a lifespan and durability of an organic electronic device.

14 Claims, 1 Drawing Sheet

FIG. 1

CURABLE COMPOSITION

This application is a National Stage Entry of International Application No. PCT/KR2014/008901, filed Sep. 24, 2014, and claims the benefit of the priority to Korean Application No. 10-2013-0113532, filed Sep. 24, 2013 both of which are incorporated by reference in their entirety for all purposes as if fully set forth herein.

BACKGROUND

1. Field of the Invention

The present invention relates to a curable composition, an adhesive film including the same, and an organic electronic device including the same.

2. Discussion of Related Art

Organic electronic device (OED) are devices including an organic material layer generating a flow of charges using holes and electrons, and for example, include a photovoltaic device, a rectifier, a transmitter, an organic light emitting diode (OLED), and so forth.

Among OEDs, an OLED has less power consumption and a higher response speed, and forms a thinner display device or light than a conventional light source. Further, an OLED has excellent space utilization, and is expected to be applied in a variety of fields including all types of portable devices, monitors, notebook computers and TVs.

A major problem in extending compatibility and use of OLEDs is durability. Organic materials and metal electrodes included in the OLED are too easily oxidized by external factors such as moisture. Therefore, a product including an OLED is very sensitive to environmental factors. Accordingly, there is a need for development of encapsulants to prevent penetration of oxygen or moisture from an external environment with respect to an OED such as an OLED. On the other hand, in an encapsulant applied in an OED, organic volatile substances contained in the encapsulant itself may affect an organic light emitting material or an electrode part, and thus effective control of the organic volatile substances is required.

SUMMARY OF THE INVENTION

The present invention is directed to providing a curable composition capable of effectively controlling moisture, ionic substances, and other foreign substances which enter an organic electronic device, resulting in damage to an element and electrochemical corrosion, and also capable of improving the lifespan and durability of the organic electronic device, and an adhesive film including the curable composition.

Hereinafter, exemplary embodiments of the present invention will be described in detail in conjunction with the accompanying drawing. Further, in the description of the present invention, general functions or constitutions well known in a related art are omitted. Further, the accompanying drawing is a schematic view for the purpose of understanding of the present invention, in which parts unrelated to the description are omitted for clarity of explanation. In the drawing, a thickness was expanded for a clear expression of many layers and areas, and a scope of the present invention is not limited to the thickness, size, ratio, or the like shown in the drawing.

A curable composition and an adhesive film including the same according to an embodiment of the present invention may be applied to encapsulate an entire surface of an organic electronic element of an organic electronic device. Further, the adhesive film may have a single-layered or multilayered structure.

In the present disclosure, the term "organic electronic device" denotes a product or device which has an element including an organic material layer generating a flow of charges using holes and electrons between a pair of electrodes opposite to each other, and examples thereof include a photovoltaic device, a rectifier, a transmitter, an organic light emitting diode (OLED), and so forth, but are not limited thereto. In an embodiment of the present invention, the organic electronic device may be an OLED.

According to an aspect of the present invention, there is provided an exemplary curable composition which may include a curable adhesive resin, and satisfy the following Equation 1 or 2.

$$X \leq 1,000 \text{ ppm} \qquad \text{[Equation 1]}$$

$$Y \leq 1,000 \text{ ppm}, \qquad \text{[Equation 2]}$$

In Equation 1, X is an amount of volatile organic compounds, which is measured by preparing a film with the curable composition, maintaining 50 mg of the film sample at 150° C. for 1 hour, and using purge and trap-gas chromatography/mass spectrometry. Further, in Equation 2, Y is an amount of ionic substances contained in the curable composition, which is obtained by preparing a film with the curable composition, and measuring 50 mg of the film sample according to ASTM D 7359:2008. In an embodiment, a curable composition according to an exemplary embodiment of the present invention may satisfy both of Expressions 1 and 2.

In a detailed embodiment of the present invention, a moisture content of a film sample formed of the curable composition may be 0.01 wt % or more, and the moisture content of the film sample is measured according to ASTM D3451-06 (2012) (Standard Guide for Testing Coating Powders and Powder Coatings by Coulometric Karl Fischer Titration) after preparing a film with the curable composition, and maintaining 50 mg of the film sample under conditions of 25° C. and a relative humidity of 50% for 24 hours. That is, in Equation 1, X may be a measured amount of volatile organic compounds volatilized from components, which have a moisture content of 0.01 wt % or more as measured after maintaining the film sample of the curable composition under conditions of 25° C. and a relative humidity of 50% for 24 hours, among the components of the curable composition. Specifically, X may be an amount of volatile organic compounds volatilized after maintaining the curable composition which satisfies the above conditions at 150° C. for 1 hour (purge and trap). In the above description, the upper limit of the moisture content may be 1 wt % or less, but is not particularly limited.

In the present disclosure, the term "component of curable composition" may denote a raw material which is a base of the curable composition. In an embodiment, the component of the curable composition may be a curable adhesive resin, a curing agent, a silane coupling agent, a high-molecular-weight resin or an organic solvent as will be described below, but is not limited thereto, and is not particularly limited as long as it is a material forming the curable composition.

The curable composition according to an embodiment of the present invention may control damage to an element by a final composition, by limiting volatile materials contained in substances which may contain moisture indirectly, deliver moisture through volatilization, or be volatilized and damage an organic element. Since moisture may result in the worst damage to the element of the organic electronic device, physical and chemical damage to the organic electronic device may be prevented by controlling moisture.

In the above description, X, which is an amount of volatile organic compounds, was measured using a commonly utilized volatile organic compound (VOC) analyzer. More specifically, the amount of a volatile organic compound, which is volatilized through purge and trap after about 50 mg of the film sample is maintained at 150° C. for 1 hour with toluene as a standard reagent, may be 1,000 ppm or less, 900 ppm or less, 800 ppm or less, 700 ppm or less, 600 ppm or less, 500 ppm or less, 300 ppm or less, or 200 ppm or less. Further, Y, which is an amount of ionic substances contained in the curable composition and measured through the ASTM D 7359:2008 measurement method, may be 1,000 ppm or less, 900 ppm or less, 800 ppm or less, 700 ppm or less, 600 ppm or less, or 550 ppm or less. In an embodiment of the present invention, physical and chemical damage to the organic electronic device may be prevented by controlling a total amount of the volatile organic compounds and a total amount of the ionic substances contained in the curable composition as described above. More specifically, acid or base ionic substances may cause corrosion of wires in the organic electronic device, thus resulting in electrochemical corrosion of the organic electronic device and occurrence of dark spots.

In the present disclosure, the term "volatile organic compound (VOC)" may be defined as all organic compounds present in a gas phase in the atmosphere. "VOC" is a common term used to denote all organic materials which may be present in a gas phase at room temperature and atmospheric pressure such as hydrocarbons composed only of carbon and hydrogen, halogenated hydrocarbons, hydrocarbons containing nitrogen or sulfur, and the like, and may include semi-volatile organic compounds in a broader sense. For example, VOCs may denote organic solvents, by-products generated from pyrolysis of a curing agent, by-products generated from an addition reaction, etc.

In the present disclosure, the term "purge and trap (P&T)" may denote a VOC-preprocessing device or method, delivering minute amounts of VOCs that are extracted and concentrated during gas chromatography (GC) or gas chromatography/mass spectrometry (GC/MS). In a process used, a VOC-containing sample is put into a small airtight container, and then VOC materials of the sample are purged using a carrier gas and moved to a trap. In the trap, VOCs are collected, and heated again to pass through to GC.

In the present disclosure, GC/MS denotes an analytical device or method for separating and analyzing contents of a solution for various specimens. GC/MS includes a combination of GC used to separate a variety of compounds and MS used to measure an atomic mass of a substance entering from GC. Retention time and mass vary depending on types of the compounds. Since GC/MS is connected to computer software storing a library of a specific form of compounds, types of the substances as well as a concentration thereof are identified through comparison with the library in which compounds in a solution may be determined. A successive investigation after determining presence of the compounds is usually performed through GC to analyze a specific material.

The VOC according to an embodiment of the present invention may be a substance having a vapor pressure of 0.01 psi or more, 0.015 psi or more, 0.02 psi or more, or 0.025 psi or more. Since all materials having a high-vapor pressure and volatility are VOCs, the upper limit of the vapor pressure is not particularly limited, but may be 1 psi or less. Further, the VOC according to an embodiment of the present invention may have a boiling point of 200° C. or less, 150° C. or less, 120° C. or less, 115° C. or less, or 100° C. or less, and the lower limit thereof may be 50° C. or more, but is not particularly limited thereto.

In the present disclosure, the term "ionic substance" is not particularly limited as long as the substance is capable of causing wire corrosion of an organic electronic device. For example, the ionic substance may be halogen ions, and may be chlorine ions. As the ionic substance, halogen ions may result in electrochemical corrosion of the organic electronic device, and thus damage to the organic electronic device may be prevented by controlling the content of the halogen ions.

In an embodiment, the curable composition includes the curable adhesive resin as described above. In an embodiment, the curable adhesive resin may be properly selected to satisfy the aforementioned Equation 1 or 2. In an embodiment, the curable adhesive resin may have a water vapor transmission rate (WVTR) of 50 g/m$^2$·day or less, preferably 30 g/m$^2$·day or less, more preferably 20 g/m$^2$·day or less, and most preferably 15 g/m$^2$·day or less in a cured state. The term "cured state of curable adhesive resin" denotes that the curable adhesive resin is changed to a state in which the curable adhesive resin may retain components such as moisture absorbents, fillers, and the like, and may exhibit performance as a structural curable composition, as applied as an encapsulant after being cured or cross-linked independently or through a reaction with other components such as a curing agent, or the like. In an embodiment of the present invention, the WVTR denotes a WVTR of a curable adhesive resin, and the WVTR is obtained after the curable adhesive resin is cured, formed to be a film type having a thickness of 100 μm, and measured in a thickness direction of the cured material under conditions of 38° C. and a relative humidity of 100%. The lower the WVTR of the curable adhesive resin is, the higher the moisture barrier property thereof is, and thus the lower limit of the WVTR is not particularly limited. For example, the lower limit of the WVTR of the curable adhesive resin may be 0 g/m$^2$·day or 0.01 g/m$^2$·day. Penetration of moisture, water vapor, oxygen, or the like into the organic electronic device may be effectively suppressed by controlling the WVTR to be in the above range.

Specific types of the curable adhesive resin that may be used in the present invention are not particularly limited, and for example, any of various heat-curable or photo-curable resins well known in a related art may be used. The term "heat-curable resin" denotes a resin which may be cured by properly applying heat or aging, and the term "photo-curable resin" denotes an electromagnetic-wave-curable resin. Further, in the category of electromagnetic waves, microwaves, infrared (IR) rays, ultraviolet (UV) rays, X rays and gamma rays, and a particle beam such as an alpha-particle beam, a proton beam, a neutron beam or an electron beam may be included. In an embodiment of the present invention, as an example of the photo-curable resin, a cationic photo-curable resin may be included. The cationic photo-curable resin denotes a resin which may be cured through cationic polymerization or a cationic curing reaction induced by electromagnetic wave radiation. Further, the curable adhesive resin may be a dual-curable resin including both heat-curable and photo-curable properties.

In an embodiment of the present invention, specific types of the curable adhesive resin are not particularly limited as long as the curable adhesive resin has the characteristics described above. For example, as the resin which may exhibit an adhesive characteristic after curing, a resin including one or more heat-curable functional groups such as a glycidyl group, an isocyanate group, a hydroxy group, a carboxyl group, an amide group, or the like, or one or more electromagnetic-wave-curable functional groups such as an epoxide group, a cyclic ether group, a sulfide group, an acetal group, a lactone group, or the like may be included. Further, in a specific type of the resin described above, an acryl resin, a polyester resin, an isocyanate resin, an epoxy resin, or the like may be included, but is not limited thereto.

In the present disclosure, the curable adhesive resin may be a low-chlorine-grade epoxy resin. Specifically, when an epoxy resin is used, a high-purity epoxy resin of which a content of halogen ions is decreased may be used, and more specifically, the high-purity epoxy resin having a halogen ion content of 1,000 ppm or less, 800 ppm or less, 600 ppm or less, 500 ppm or less, 400 ppm or less, or 300 ppm or less as measured according to ASTM D 7359:2008 may be used. In an embodiment, the halogen ions may be chlorine ions. As described above, the ionic substance such as the halogen ions may cause wire corrosion of the organic electronic element, resulting in electrochemical corrosion of the organic electronic device and generation of dark spots. Accordingly, volatile materials may be inhibited by using the high-purity epoxy resin. Further, in an embodiment, the epoxy resin may be in a liquid phase or a semi-solid phase.

In an embodiment of the present invention, as the curable adhesive resin, an aromatic or aliphatic epoxy resin; or a linear or branched epoxy resin may be used. In an embodiment of the present invention, as an epoxy resin containing two or more functional groups, an epoxy resin having an epoxy equivalent in a range of 180 to 1,000 g/eq may be used. When the epoxy resin having an epoxy equivalent in the above range is used, characteristics of the cured material such as adhesive performance and a glass transition temperature may be effectively maintained. Such an epoxy resin may be one or mixtures of at least two of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, or a dicyclopentadiene modified phenol-type epoxy resin.

In an embodiment of the present invention, an epoxy resin having a ring-shaped structure in its molecular structure may be used, and more preferably, an epoxy resin including an aromatic group (e.g., a phenyl group) may be used. When the epoxy resin includes the aromatic group, a cured material may have excellent thermal and chemical stability, and show a low moisture-absorption amount, and thus improve structural reliability of the encapsulant of the organic electronic device. Specific examples of the aromatic-group-containing epoxy resin that may be used in the present invention may include one or mixtures of at least two of a biphenyl-type epoxy resin, a dicyclopentadiene-type epoxy resin, a naphthalene-type epoxy resin, a dicyclopentadiene modified phenol-type epoxy resin, a cresol-type epoxy resin, a bisphenol-type epoxy resin, a xyloc-type epoxy resin, a multifunctional epoxy resin, a phenol novolac epoxy resin, a triphenol methane-type epoxy resin, an alkyl-modified triphenol methane epoxy resin, or the like, but are not limited thereto.

In an embodiment, as the epoxy resin in an embodiment of the present invention, a silane-modified epoxy resin, preferably, a silane-modified epoxy resin having an aromatic group, may be used. Thus, when an epoxy resin which is modified with silane and structurally has a silane group is used, adhesion with an inorganic material such as a glass substrate, a substrate, or the like is maximized, and moisture barrier properties, durability, reliability, and so forth may be also improved. Further, since by-products from alcohol components are generated when a silane coupling agent is used as will be described below, the use of the silane-modified epoxy resin is effective in minimizing a content of the silane coupling agent which may damage the organic electronic device due to the by-products. Further, in consideration of the suppression of an ionic substance generation, the silane-modified epoxy resin may be a high-purity epoxy resin in which a content of halogen ions is decreased, and more specifically, may be the silane-modified epoxy resin having the halogen ion content of 1,000 ppm or less, 800 ppm or less, 600 ppm or less, 500 ppm, 400 ppm or less, or 300 ppm or less as measured according to ASTM D 7359: 2008. Accordingly, the VOCs described above may be effectively controlled. Specific types of the epoxy resin as described above that may be used in the present invention are not particularly limited, for example, the resins described above may be easily purchased from vendors such as Kukdo Chemical Co., Ltd., etc.

The curable composition according to an embodiment of the present invention may include one or more selected from the group consisting of a curing agent, a silane coupling agent and an organic solvent.

In an embodiment of the present invention, substances capable of entering the organic electronic device as VOCs, damaging the element, and causing electrochemical corrosion may include organic solvents, and thus generation of trace elements and an organic volatilization amount of the curable composition may be reduced by controlling the organic solvents. The boiling point of the organic solvent may be in a range of 100° C. or less, 95° C. or less, 90° C. or less, 85° C. or less, or 80° C. or less, and the lower limit thereof may be 50° C. or more, but is not particularly limited. More specifically, the organic solvent may include hydrocarbon solvents, alcohols, ester compounds, ketones or ether compounds. For example, the solvent that may be used in the present invention may include one or mixtures of at least two of methyl ethyl ketone (MEK), acetone, toluene, dimethyl formamide (DMF), methyl cellosolve (MCS), tetra-hydrofuran (THF), N-methyl pyrrolidone (NMP), ethyl cellosolve (ECS), or the like, but is not limited thereto.

The curable composition according to an embodiment of the present invention may further include a curing agent which may form a matrix such as a cross-linked structure or the like by reacting with the curable adhesive resin. A specific type of the curing agent that may be used in the present invention is not specifically limited and may be properly selected depending on a used curable adhesive resin or a type of the functional group included in the resin, and particularly, a curing agent having a small amount of by-products or unreacted materials upon VOC analysis is preferable. For example, when an epoxy resin is used as the curable adhesive resin, an epoxy resin well-known as a curing agent in the related art may be used, and more specifically, one or mixtures of at least two of all sorts of amine-based compounds, imidazole-based compounds, phenol-based compounds, phosphorus-based compounds, acid anhydride-based compounds, or the like may be used without being limited thereto. In an embodiment, the curing agent may be an imidazole-based compound in order to minimize by-products of the reaction and a reaction temperature.

The curable composition according to an embodiment of the present invention, for example, may include the curing agent at an amount of 0.5 to 20 parts by weight, preferably, 1 to 10 parts by weight with respect to 100 parts by weight of the heat-curable resin. However, the above content is merely one example. That is, a content of the curing agent may be changed according to a type and content of the curable adhesive resin or the functional group, or a matrix structure or crosslinking density to be implemented in an embodiment of the present invention.

As described above, the curing agent according to an embodiment of the present invention preferably generates a small amount of heat-by-products, unreacted materials, or materials formed by an addition reaction upon VOC analysis. In an embodiment, the curing agent may be an imidazole curing agent which starts to cure at a temperature in a range of 50 to 170° C. For example, the imidazole-based compound may include one or more selected from the group consisting of 2-ethyl imidazole, 2-ethyl-4-methylimidazole, 2-aminobenzeneimidazole, 2-amino-4-imidazolecarboxyamide, 2-aminoimidazolesulphate, 2-(trifluoromethyl)benzimidazole, 1-benzimidazole, 4,5-diphenyl-2-imidazolethiol, 2-methyl-5-nitroimidazole, 4-nitroimidazole, 2,4,5-tribromoimidazole, 4-phenylimidazole, 2-(2-pyridyl)benzimidazole, 2-benzimidazolemethanol, 4-amino-5-imidazolecarboxyamide hydrochloride, 2-(aminomethyl)benzimidazole dehydchloride, 5-chloro-2-(trichloromethyl)benzimidazole, 4-methylimidazole, 4-methyl-5-imidazolecarboxylate, 4-(hydroxymethyl)imidazole hydrochloride, 4-imidazoleacetic acid, 2-phenylimidazole, 4-methyl-5-imidazolemethanol hydrochloride, 2-ethyl imidazole, 4,5-imidazoledicarboxylic acid, 2-mercapto-5-nitrobenzimidazole, 5-nitrobenzimidazole nitrate, 2-imidazolecarboxyaldehyde, 4,5-dichloroimidazole, 2-mercaptoimidazole, 2-(4-thiazole) benzimidazole, 5-benzimidazolecarboxylic acid, imidazole hydrochloride, 5-methylbenzimidazole, 2-mercapto-5-methylbenzimidazole, 4,5-dicyanoimidazole, 2-imidazolecarboxylaldehyde, trimethylsilylimidazole, 2-benzimidazolepropionic acid, 2-isopropylimidazole, 4-methyl-2-phenylimidazole, 2-propylimidazole, 2-amino-4,5-imidazolecarbonylnitrile, 5-methoxy-2-benzimidazolethiol, 2-mercapto-5-benzimidazolesulfonic acid, 2-(allylthio)benzimidazole, 4(5)-imidazoledicarboxylic acid, 4-methyl-5-imidazolecarboxylaldehyde, 2-undecylimidazole, 2-chlorobenzimidazole, 4-imidazolecarboxylic acid, 4,5-diphenyl-2-imidazolethiol, imidazole, 2-phenyl-5-benzimidazolesulfonic acid hydrate, 5-methyl-4-nitroimidazole, 5-methoxybenzimidazole, 2-phenylimidazole, 5-amino-2-mercaptanbenzimidazole, 5-ethoxy-2-mercaptobenzimidazole, 2-nonyl benzimidazole, 2-hydroxybenzimidazole, 2-bromo-4,5-dichloroimidazole, 4,5-dicyanoimidazole, 2-butyl-4-chloro-5-(hydromethyl)imidazole, 4-(hydromethyl)imidazole hydrochloride, 2-butyl-4-chloro-5-formylimidazole, 5-azabenzyl imidazole, and 5-amino-2-(trifluoromethyl)benzimidazole.

In another embodiment, the curing agent may include a first curing agent which starts to cure at a temperature in a range of 50 to 120° C. and/or a second curing agent which starts to cure at a temperature of more than 120° C. and 170° C. or less. Accordingly, the second curing agent may be separately used. As described above, processability, storage stability, and a process speed according to a curing speed may be controlled by mixing an intermediate-speed curing agent which starts to cure at about 100° C. and a slow-speed curing agent which starts to cure at about 150° C. On the other hand, when the curing agent which starts to cure at a temperature of less than 100° C. is used separately, storage stability is reduced and heat stability is decreased in the process. When the curing agent which starts to cure at the specific temperature as described above is used, degradation of the organic electronic element may be prevented, and volatile components generated by pyrolysis and an addition reaction may be avoided.

In an embodiment, as the first curing agent which starts to cure at a temperature in a range of 50 to 120° C., one or more selected from the group consisting of 2-undecylimidazole, 2-heptadecylimidazole(2-heptadecylimidazole), 2-phenylimidazole, 2-phenyl-4-methylimidazole (2-phenyl-4-methylimidazole), 1-benzyl-2-phenylimidazole, 1-cyanoethyl-2-methylimidazole, 1-cyanoethyl-2-ethyl-4-methylimidazole, 1-cyanoethyl-2-undecylimidazole and 2-phenylimidazoline may be included. Further, as the second curing agent which starts to cure at a temperature of more than 120° C. and 170° C. or less, one or more selected from the group consisting of 2-phenyl-4-methyl-5-hydroxyimidazole, 1-cyanoethyl-2-phenylimidazole, 1-cyanoethyl-2-undecylimidazolium-trimellitate, 2,4-diamino-6 [2'-undecylimidazolyl-(1')]-ethyl-s-triazine, 2,4-diamino-6-[2'-ethyl-4'-methylimidazolyl-(1')]-ethyl-s-triazine, 1-cyano-2-phenylimidazolium-trimellitate, 2-phenylimidazole isocyanuric acid adducts, and 1-benzyl-2-phenylimidazole hydrobromide may be included. In an embodiment, the first curing agent may be included at 0.1 to 20 parts by weight with respect to 100 parts by weight of the resin, and the second curing agent may be included at 0.1 to 20 parts by weight with respect to 100 parts by weight of the resin.

Further, the curable composition according to an embodiment of the present invention may further include a curing catalyst. The curing catalyst is not limited as long as it generates a small amount of by-products by heat, unreacted materials or materials generated from the addition reaction upon VOC analysis, and for example, a 3-grade amine-based material is preferable. The curing catalyst may include one or more selected from the group consisting of triethylenediamine, benzyldimethylamine, triethanolamine, dimethylaminoethanol, tris(dimethylaminomethyl)phenol, 2-methylimidazole, 2-phenylimidazole, 2-phenyl-4-methylimidazole, and 2-heptadecylimidazole.

The curable composition according to an embodiment of the present invention may further include a silane coupling agent. The silane coupling agent increases adhesion and adhesive stability of an adhesive, improves heat resistance and humidity resistance, and also enhances adhesion reliability when subjected to severe conditions for a long time. However, since the silane coupling agent generates by-products of the alcohol component by heat, it is preferable to minimize a content of the silane coupling agent within the scope of the object of the present invention. As the silane coupling agent, for example, one type or mixtures of at least two types of gamma-glycidoxypropyl triethoxy silane, gamma-glycidoxypropyl trimethoxy silane, gamma-glycidoxypropyl methyldiethoxy silane, gamma-glycidoxypropyl triethoxy silane, 3-mercaptopropyl trimethoxy silane, vinyltrimethoxysilane, vinyltriethoxy silane, gamma-methacryloxypropyl trimethoxy silane, gamma-methacryloxy propyl triethoxy silane, gamma-aminopropyl trimethoxy silane, gamma-aminopropyl triethoxy silane, 3-isocyanato propyl triethoxy silane, gamma-acetoacetatepropyl trimethoxysilane, gamma-acetoacetatepropyl triethoxy silane, beta-cyanoacetyl trimethoxy silane, beta-cyanoacetyl triethoxy silane, acetoxyaceto trimethoxy silane, or the like may be used. It is preferable to use the silane coupling agent having an acetoacetate group or a beta-cyanoacetyl group, but is not limited thereto. The curable composition may include the silane coupling agent in a range of less than 2 parts by weight, 0.01 to 1.9 parts by weight, 0.01 to 1.8 parts by weight, 0.01 to 1.5 parts by weight, or 0.01 to 1.3 parts by weight with respect to 100 parts by weight of the curable adhesive resin. When the silane coupling agent is included at 2 parts by weight or more, dark spots may occur due to by-products of the alcohol component generated from the silane coupling agent, and bubble-occurrence frequency may increase upon bonding and curing.

The curable composition according to an embodiment of the present invention may include a moisture absorbent as necessary. The term "moisture absorbent" may be used as a collective term for components capable of absorbing or removing moisture or water vapor entering from the outside through a physical or chemical reaction. That is, the moisture absorbent denotes a moisture-reactive absorbent or physical absorbent, and mixtures thereof may also be used.

The moisture-reactive absorbent absorbs moisture or water vapor by chemically reacting with water vapor, moisture or oxygen entering an adhesive film including the curable composition. The physical absorbent may lengthen the traveling path of moisture or water vapor penetrating into an encapsulating structure to be described below, thereby suppressing penetration thereof, and may maximize barrier properties with respect to moisture and water vapor through a matrix structure of the curable adhesive resin and interaction with the moisture-reactive absorbent, etc.

Types of the moisture absorbent that may be used in the present invention are not particularly limited, for example, the moisture-reactive absorbent may include one type or mixtures of at least two types of metal powders such as alumina or the like, a metallic oxide, metal salts, phosphorus pentoxide ($P_2O_5$), or the like, and the physical absorbent may include silica, zeolite, titania, zirconia, montmorillonite, or the like.

Specific examples of the metallic oxide in the above may include, but are not limited, lithium oxide ($Li_2O$), sodium oxide ($Na_2O$), barium oxide (BaO), calcium oxide (CaO), magnesium oxide (MgO), or the like, and examples of the metal salts may include, but are not limited, sulfates such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), nickel sulfate ($NiSO_4$), or the like; metal halides such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_1$), magnesium iodide ($MgI_2$), or the like; or metal chlorates such as barium perchlorate ($Ba(ClO_4)_2$), magnesium perchlorate ($Mg(ClO_4)_2$), or the like.

In an embodiment of the present invention, the moisture absorbent such as the metallic oxide, or the like, may be properly processed and mixed with the composition. For example, an adhesive film, which is a film type prepared from the aforementioned curable composition, may be formed to have a shape of a thin film having a thickness of 30 µm or less according to types of the organic electronic device to be applied, and here, a milling process of the moisture absorbent may be required. The milling process of the moisture absorbent may include processes such as three roll mill, bead mill, ball mill, etc.

The curable composition according to an embodiment of the present invention may include the moisture absorbent at an amount in a range of 0 to 100 parts by weight, 1 to 90 parts by weight, 5 to 80 parts by weight, or 10 to 50 parts by weight with respect to 100 parts by weight of the curable adhesive resin. Although the moisture absorbent, as an optional component, may not be included, a cured material may exhibit superior moisture and water vapor barrier properties by preferably controlling the moisture absorbent content to be included at 5 parts by weight or more. Further, by controlling the moisture absorbent content to be included at 100 parts by weight or less, the cured material may exhibit excellent moisture barrier properties while forming an encapsulating structure of a thin film.

In the present disclosure, unless otherwise defined, a unit of "parts by weight" denotes a weight ratio between the components.

The curable composition according to an embodiment of the present invention may further include a high-molecular-weight resin. When the composition according to an embodiment of the present invention is formed in the shape of a sheet or film, the high-molecular-weight resin may serve to improve formability. Further, the high-molecular-weight resin may serve as a high-temperature-viscosity control agent controlling flowability in a hot-melting process.

Examples of the high-molecular-weight resin that may be used in the present invention are not particularly limited as long as the high-molecular-weight resin has compatibility with other components such as the curable adhesive resin, etc. However, when an excess amount of halogen ions is included in the high-molecular-weight resin, the organic electronic element may be affected thereby, and thus a high-purity-low-chlorine grade high-molecular-weight resin may be used. Specifically, the high-molecular-weight resin may include halogen ions at a content of 1,000 ppm or less, 900 ppm or less, 500 ppm or less, 700 ppm or less, 600 ppm or less, or 550 ppm or less as measured according to ASTM D 7359:2008. In an embodiment, the halogen ions may be chlorine ions. Specific examples of the high-molecular-weight resin to be used may include, as a resin having a weight-average molecular weight of 20,000 or more, one or mixtures of at least two of a phenoxy resin, an acrylate resin, a high-molecular-weight epoxy resin, an ultra-high-molecular-weight epoxy resin, a high polarity functional group-containing rubber, and a high polarity functional group containing-reactive rubber, but are not limited thereto.

When the curable composition according to an embodiment of the present invention includes the high-molecular-weight resin, a content of the high-molecular-weight resin is controlled depending on desired physical properties, and is not particularly limited. For example, the high-molecular-weight resin may be contained at an amount in a range of 20 to 200 parts by weight, preferably 20 to 150 parts by weight, and more preferably 30 to 100 parts by weight with respect to 100 parts by weight of the curable adhesive resin in an embodiment of the present invention. By controlling a content of the high-molecular-weight resin to be included at 200 parts by weight or less in an embodiment of the present invention, compatibility of the resin composition and each component may be effectively maintained, and the resin composition may also function as an adhesive.

The curable composition according to an embodiment of the present invention may further include additives for improving durability of the cured material, such as a filler, a leveling agent, a dispersant, an antifoamer, a UV stabilizer, and an antioxidant, within a range in which a small amount of by-products by heat, unreacted materials, materials generated from an addition reaction is formed upon VOC analysis.

The present invention also relates to an adhesive film including the curable composition described above.

A structure of the adhesive film according to an embodiment of the present invention is not particularly limited as long as the adhesive film includes the curable composition, but in an embodiment, the adhesive film may have a structure including a base film or release film (which may hereinafter be referred to as a "first film"); and the curable composition formed on the base film or release film.

The adhesive film according to an embodiment of the present invention may further include a base film or release film formed on the curable composition (which may hereinafter be referred to as a "second film").

Specific examples of the first film that may be used in the present invention are not particularly limited. In an embodiment of the present invention, for example, a typical polymer film in the related art may be used as the first film. In an embodiment of the present invention, examples of the base or release film may include a polyethylene terephthalate (PET) film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acetate copolymer film, an ethylene-methyl acetate copolymer film, a polyimide film, or the like. Further, one or both sides of the base film or the release film may be subjected to proper release treatment in an embodiment of the present invention. Examples of a release agent used for release treatment of the base film may include alkyd-based, silicone-based, fluorine-based, unsaturated ester-based, polyolefin-based, wax-based release agents, etc. Among these, alkyd-based, silicone-based, or fluorine-based release agents may be preferably used in terms of heat resistance, but the release agent is not limited thereto.

Further, types of the second film that may be used in the present invention (which may hereinafter be referred to as a "cover film") are not particularly limited either. For example, in an embodiment of the present invention, the same type of film as the first film or a different type of film from the first film may be used as the second film within the range in which the first film is exemplified as described above. Further, the second film may also be subjected to proper release treatment in an embodiment of the present invention.

In an embodiment of the present invention, the thickness of the base film or the release film (first film) is not particularly limited, and may be adjusted properly depending on a purpose. For example, a thickness of the first film may be in a range of 10 to 500 μm, preferably 20 to 200 μm in an embodiment of the present invention. When the thickness of the first film is less than 10 μm, the base film may be easily deformed in a manufacturing process, and when the thickness of the first film is more than 500 μm, economic efficiency decreases.

Further, a thickness of the second film is not particularly limited either in an embodiment of the present invention. In an embodiment of the present invention, for example, a thickness of the second film may be set to be the same as that of the first film. Further, in consideration of processability, a thickness of the second film may be set to be relatively thinner than that of the first film.

A thickness of the curable composition included in the adhesive film according to an embodiment of the present invention is not particularly limited, and may be properly selected according to the following conditions in consideration of a purpose of the applied film.

In an embodiment of the present invention, a method of preparing the adhesive film as described above is not particularly limited. For example, the method of preparing the adhesive film may include a first step in which a coating solution containing the curable composition described above is coated on the base film or the release film; and a second step in which the coating solution applied in the first step is dried.

The method of preparing the adhesive film according to an embodiment of the present invention may further include a third step in which a base film or release film is additionally pressed onto the coating solution dried in the second step.

The first step according to an embodiment of the present invention is a step of preparing a coating solution by dissolving or dispersing the curable composition described above in a proper solvent. In this process, a content of the epoxy resin or the like contained in the coating solution may be properly controlled depending on a purpose.

Types of the solvent used for preparing the coating solution in an embodiment of the present invention are not particularly limited. However, when a drying time of the solvent is excessively prolonged or drying at high temperature is required, problems may occur in terms of workability or durability of the adhesive film, and thus the solvent having a volatilization temperature of 200° C. or less, 130° C. or less, or 100° C. or less may be preferably used. Examples of the solvent that may be used in the present invention may include, but are not limited to, one type or mixtures of at least two types of methyl ethylketone (MEK), acetone, toluene, dimethyl formamide (DMF), methyl cellosolve (MCS), tetra-hydrofuran (THF), N-methyl pyrrolidone (NMP), ethyl cellosolve (ECS), etc.

A method of applying the coating solution as described above onto the base film or the release film in the first step according to an embodiment of the present invention is not particularly limited, and for example, knife coating, roll coating, spray coating, gravure coating, curtain coating, comma coating, lip coating, or the like may be used without limitation.

The second step according to an embodiment of the present invention is a step of forming an adhesive layer containing the curable adhesive resin by drying the coating solution coated in the first step. That is, in the second step according to an embodiment of the present invention, the adhesive layer may be formed by heating, drying, and removing the coating solution applied onto the film. Here, a drying condition is not particularly limited, and for example, the drying may be performed at a temperature in a range of 70 to 200° C. for 1 to 10 minutes.

The method of preparing the adhesive film according to an embodiment of the present invention may further include the third step of pressing an additional base film or release film on the curable composition formed on the film following the second step.

In the third step according to an embodiment of the present invention as described above, the additional release film or base film (cover film or second film) may be pressed through hot-roll laminating or a pressing process after the curable composition is coated onto the film. Here, the third step may be performed by a hot-roll-laminating method to enable a continuous process and improve effectiveness, and the process may be performed at a temperature in a range of about 10 to 100° C. and a pressure in a range of about 0.1 to 10 kg/cm².

According to another aspect of the present invention, there is provided an organic electronic device including a substrate; an organic electronic element formed on the substrate; and the aforementioned adhesive film encapsulating the organic electronic element. The adhesive film may cover the entire surface of the organic electronic element.

Further, the organic electronic element may be an organic light emitting diode in an embodiment of the present invention.

The organic electronic device may further include a protective layer protecting the organic electronic element between the adhesive film and the organic electronic element.

According to still another aspect of the present invention, there is also provided a method of preparing an organic electronic device, which includes applying the adhesive film containing the curable composition described above onto a substrate on which an organic electronic element is formed to cover the organic electronic element. In an embodiment, the production method may further include a step of curing the adhesive film containing the curable composition.

The step of applying the adhesive film onto the organic electronic element may be performed through a hot-roll laminating, heat press, or vacuum press method, but is not particularly limited.

The step of applying the adhesive film onto the organic electronic element may be performed at a temperature in a range of 50 to 90° C., and the step of curing the adhesive film may be performed by heating to a temperature in a range of 70 to 110° C. or irradiating with UV rays.

Figure 1:
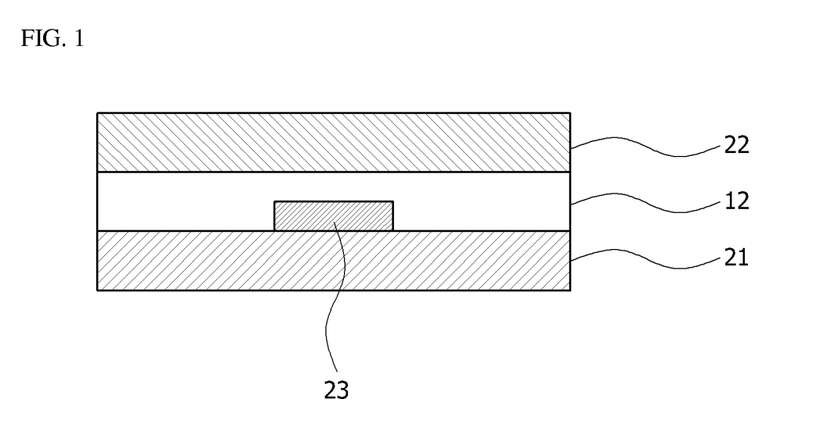
FIG. 1 is a cross-sectional view illustrating an organic electronic device according to an embodiment of the present invention.

According to the method of preparing the organic electronic device in an embodiment of the present invention, a transparent electrode is formed on a substrate 21 such as a glass or polymer film using a method such as vacuum deposition, sputtering, or the like, and an organic material layer is formed on the transparent electrode. The organic material layer may include a hole injection layer, a hole transport layer, a light-emitting layer, an electron injection layer, and/or an electron transport layer. Subsequently, a second electrode is formed on the organic material layer. Then, the adhesive film 12 described above is applied onto the upper part of the organic electronic element 23 of the substrate 21 to completely cover the organic electronic element 23. Here, a method of applying the adhesive film 12 is not particularly limited, and for example, a cover substrate (e.g., glass or polymer film) 22 to which the curable composition of the adhesive film according to an embodiment of the present invention is transferred in advance may be applied on the upper part of the organic electronic element 23 formed on the substrate 21 using a method such as heating, pressing, etc. In the above process, for example, a transfer of the adhesive film 12 to the cover substrate 22 may be performed while applying heat using a vacuum press, a vacuum laminator, and the like after delaminating a base or release film formed on the film using the aforementioned adhesive film according to an embodiment of the present invention. In this process, when a curing reaction of the adhesive film is performed in a certain range or more, bonding strength and adhesive force may be reduced, and thus it is preferable to control a process temperature to be about 100° C. or less, and a process time to be within 5 minutes. Similarly, when heat pressing the cover substrate 22 to which the adhesive film 12 is transferred in advance onto the organic electronic element, a vacuum press or a vacuum laminator may also be used. A temperature condition in this step may be set as described above, and a process time is preferably within 10 minutes.

Further, an additional curing process may be performed with respect to the adhesive film to which the organic electronic element is pressed in an embodiment of the present invention. For example, the curing process (primary curing) may be performed in a heat chamber or UV chamber. The condition of primary curing may be properly selected in consideration of stability of the organic electronic device.

However, the manufacturing process described above is merely one example for encapsulating the organic electronic element according to an embodiment of the present invention, and the process order and the process conditions may be arbitrarily modified. For example, an order of the transfer and press process in an embodiment of the present invention may be changed as a method in which the adhesive film 12 is transferred to the organic electronic element 23 on the substrate 21 first, and then the cover substrate 22 is pressed thereto. Further, after forming a protective layer on the organic electronic element 23 and applying the adhesive film 12 thereto, the applied adhesive film 12 may be cured without pressing the cover substrate 22 thereto and used.

EFFECTS

When the curable composition according to an embodiment of the present invention is applied to a film encapsulating the organic electronic device, the encapsulating film may protect the element, prevent damage to the element from moisture contained in the composition, ionic substances, and other foreign substances, and effectively block electrochemical corrosion, and thus a lifespan and durability of the organic electronic device may be improved.

DESCRIPTION OF REFERENCE NUMERALS

12: adhesive film
21: substrate
22: cover substrate
23: organic electronic element

DETAILED DESCRIPTION OF EXEMPLARY EMBODIMENTS

Hereinafter, the present invention will be described in detail in conjunction with examples according to the present invention and comparative examples not according to the present invention, but the scope of the present invention is not intended to be limited to the examples described below.

Example 1

100 g of low-chlorine BPA type epoxy (Epiclon 840S; DIC Corporation), 50 g of a phenoxy resin (PKFE; InChem Corporation), 0.5 g of a silane coupling agent (KBM-403) and 3 g of an imidazole curing agent (2PZ) were added with methyl ethylketone such that a content of solid fractions was 50%, and stirred to prepare a coating solution.

The prepared solution was applied onto a release surface of a release PET film using a comma coater, and dried at 110° C. for 3 minutes, and then an adhesive film having a thickness of 20 μm was formed.

Example 2

An adhesive film was prepared in the same method as Example 1 except that a silane-modified epoxy resin (KSR- 177) was added instead of the low-chlorine BPA type epoxy, and a silane coupling agent was not added.

Example 3

An adhesive film was prepared in the same method as Example 1 except that C11ZA (SHIKOKU CHEMICALS CORPORATION) which starts to cure at a high temperature was added instead of the imidazole curing agent 2PZ.

Comparative Example 1

An adhesive film was prepared in the same method as Example 1 except that an epoxy resin (Epiclon 840) was added instead of the low-chlorine BPA type epoxy, and 3 phr of a reactive dilution agent (PG-202; Kukdo Chemical Co., Ltd.) was added.

Comparative Example 2

An adhesive film was prepared in the same method as Example 1 except that 2 parts by weight of a silane coupling agent was added with respect to 100 parts by weight of a resin, xylene was added instead of the methyl ethylketone as an organic solvent, and the applied solution was dried at 100° C. for 1 minute.

Experimental Example 1: Total Volatile Organic Compounds (VOC) Measurement

Measurement device: Purge & Trap sampler-GC/MSD system (P & T: JAI JTD-505III, GC/MS: Agilent 7890B/5977A)

Samples of the films prepared in examples and comparative examples were weighed to about 50 mg, passed through purge and trap at 150° C. for 1 hour, and a total amount of VOCs was measured through GC-MS. The measured volatilization amount was quantified using toluene as a standard reagent.

Experimental Example 2: Ionic Substance (Trace Element) Measurement

Preprocessing of the samples weighed to about 50 mg and having films applied thereto was performed according to EN 50267-2-1 & 502672-2, and a trace element was measured according to ASTM D 7395:2008.

Evaluation Method: Dark Spot

An element available for a lighting test was deposited on a glass substrate. After the adhesive film on a coated sheet was heat-laminated on the glass substrate for encapsulating, the film was vacuum-pressed for 3 minutes at a pressure of 5 kg/cm² while being heated at 80° C. on the substrate. The pressed sample was thermally cured at 100° C. for 2 hours in an oven. The thermally cured sample was observed under conditions of a constant temperature and humidity of 85° C. and 85% RH, and checked for dark spots. Through an observation for 300 hours, it was checked whether or not dark spots were generated on the sample.

Evaluation Method: Wire Corrosion and Bubble Formation

An element was deposited on a glass substrate. After the adhesive film on a coated sheet was heat laminated on the glass substrate for encapsulating, the film was vacuum-pressed for 3 minutes at a pressure of 5 kg/cm² while being heated at 80° C. on the substrate. The pressed sample was thermally cured at 100° C. for 2 hours in an oven. After applying the adhesive film on the organic electronic element as described above, the film was checked with the naked eye for wire corrosion and bubbles.

TABLE 1

| | VOCs (ppm) | Ionic substance (ppm) | Dark spot | Etc. (Wire corrosion and bubbles) |
|---|---|---|---|---|
| Example 1 | 193 | 510 | None | Good |
| Example 2 | 156 | 675 | None | Good |
| Example 3 | 164 | 509 | None | Good |
| Comparative Example 1 | 1183 | 1288 | Generated | Wire corrosion |
| Comparative Example 2 | 1567 | 555 | Generated | Bubbles formed on pressing/curing |

As shown in Table 1, in Example 1 in which the low-chlorine BPA type epoxy resin was used, and a small amount of the silane coupling agent was used, VOCs and ionic substances were both effectively suppressed. In Example 2 in which a silane coupling agent was not included and the silane-modified epoxy resin was used, an amount of an alcoholic volatile material that caused significant damage to the organic elements was decreased. Further, in Example 3 in which the imidazole curing agent was changed, storing stability and heat stability in the process were improved by controlling a curing temperature while maintaining other conditions to be the same.

On the other hand, in Comparative Example 1 in which a generally used epoxy resin was used, a great amount of VOCs and ionic substances were generated, and in Comparative Example 2 in which 2 parts by weight of a silane coupling agent was used and xylene was used as an organic solvent, a great amount of VOCs were generated.

What is claimed is:

1. A curable composition, comprising a curable adhesive resin, a silane coupling agent at less than 2 parts by weight, with respect to 100 parts by weight of the curable adhesive resin, and a high-molecular-weight resin of which a weight-average-molecular weight is 20,000 or more, and of which a content of halogen ions is 1,000 ppm or less as measured according to ASTM D 7359:2008, wherein the high-molecular-weight resin comprises a phenoxy resin, the composition satisfying the following Equations 1 and 2:

$$X \leq 1{,}000 \text{ ppm} \qquad \text{[Equation 1]}$$

$$Y \leq 1{,}000 \text{ ppm,} \qquad \text{[Equation 2]}$$

wherein X in Equation 1 is an amount of volatile organic compounds, which is measured by preparing a film with the curable composition, maintaining 50 mg of the film sample at 150° C. for 1 hour, and using purge and trap-gas chromatography/mass spectrometry, and Y in Equation 2 is an amount of ionic substances contained in the curable composition, which is obtained by preparing a film with the curable composition, and measuring 50 mg of the film sample according to ASTM D 7359:2008, wherein a moisture content of a film sample formed of the curable composition is 0.01 wt % to 1 wt %, and the moisture content of the film sample is measured according to ASTM D3451-06 (2012) after preparing a film with the curable composition, and maintaining 50 mg of the film sample under conditions of 25° C. and a relative humidity of 50% for 24 hours.

2. The curable composition of claim 1, wherein the ionic substance is halogen ions.

3. The curable composition of claim 1, wherein the curable adhesive resin comprises one or more curable functional groups selected from a glycidyl group, an isocyanate group, a hydroxy group, a carboxyl group, an amide group, an epoxide group, a cyclic ether group, a sulfide group, an acetal group and a lactone group.

4. The curable composition of claim 1, wherein the curable adhesive resin is a silane-modified epoxy resin.

5. The curable composition of claim 1, wherein the curable adhesive resin is an epoxy resin of which a content of halogen ions is 1,000 ppm or less as measured according to ASTM D 7359:2008.

6. The curable composition of claim 1, further comprising an organic solvent of which a boiling point is 100° C. or less.

7. The curable composition of claim 1, further comprising a curing agent.

8. The curable composition of claim 7, wherein the curing agent is included at 0.5 to 20 parts by weight with respect to 100 parts by weight of the curable adhesive resin.

9. The curable composition of claim 7, wherein the curing agent is an imidazole curing agent which starts to cure at a temperature in a range of 50 to 170° C.

10. The curable composition of claim 1, wherein the high-molecular-weight resin is included at 20 to 200 parts by weight with respect to 100 parts by weight of the curable adhesive resin.

11. An adhesive film comprising the curable composition of claim 1.

12. An organic electronic device, comprising:

a substrate;

an organic electronic element formed on the substrate; and the adhesive film of claim 11 encapsulating the organic electronic element.

13. The organic electronic device of claim 12, wherein the organic electronic element is an organic light emitting diode.

14. A method of preparing an organic electronic device, comprising applying the adhesive film of claim 11 onto a substrate on which an organic electronic element is formed to cover the organic electronic element.

* * * * *